(12) United States Patent
Kim et al.

(10) Patent No.: US 6,803,292 B2
(45) Date of Patent: Oct. 12, 2004

(54) METHOD FOR MANUFACTURING A SEMICONDUCTOR DEVICE AND SEMICONDUCTOR DEVICE WITH OVERLAY MARK

(75) Inventors: Dae-Joung Kim, Suwon-si (KR); Seok-Hwan Oh, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/602,149

(22) Filed: Jun. 25, 2003

(65) Prior Publication Data

US 2004/0082139 A1 Apr. 29, 2004

(30) Foreign Application Priority Data

Aug. 9, 2002 (KR) ........................................ 2002-47249

(51) Int. Cl.⁷ .............................................. H01L 21/76
(52) U.S. Cl. ........................ 438/401; 438/238; 438/381
(58) Field of Search ......................... 438/401, 238–256, 438/381–396

(56) References Cited

U.S. PATENT DOCUMENTS 5,308,682 A  * 5/1994  Morikawa ................ 428/195.1
5,311,061 A  * 5/1994  Sheck ......................... 257/797
5,580,812 A  * 12/1996  Ikemasu et al. ............ 438/397

* cited by examiner

Primary Examiner—H. Jey Tsai
(74) Attorney, Agent, or Firm—Lee & Sterba, P.C.

(57) ABSTRACT

In a method for forming a semiconductor device and a semiconductor device having an overlay mark, a first pattern for the semiconductor device is formed in a semiconductor device formation region of a semiconductor substrate and simultaneously in a first mark formation region of the semiconductor substrate. A second pattern for the semiconductor device is formed on a resultant structure in the semiconductor device formation region of the semiconductor substrate and simultaneously in a second mark formation region of the semiconductor substrate. The first and second patterns in the first and second mark formation regions, respectively, are inspected for misalignments using overlay marks formed to have shapes and sizes identical to those of real patterns in the semiconductor device formation region of the semiconductor substrate. By measuring misalignments of real patterns using the overlay marks, overlay mismatch between the semiconductor device formation region and the overlay mark may be prevented.

4 Claims, 9 Drawing Sheets

METHOD FOR MANUFACTURING A SEMICONDUCTOR DEVICE AND SEMICONDUCTOR DEVICE WITH OVERLAY MARK

BACKGROUND OF THE INVENTION

1. Field of the Invention

The present invention relates to a method for manufacturing a semiconductor device and a semiconductor device having an overlay mark. More particularly, the present invention relates to a method for manufacturing a semiconductor device wherein mismatching between a region in which the semiconductor device is formed and an overlay mark may be minimized by forming the overlay mark to have a pattern identical to that of the region, and a semiconductor device having the overlay mark.

2. Description of the Related Art

In general, an electric circuit of a semiconductor device is manufactured through repeating a series of unit processes such as deposition, photolithography, etc., in order to form circuit patterns on a substrate. In a photolithography process, a photoresist film is exposed using a mask in which a circuit pattern is formed. The photoresist film is developed after being coated on a wafer, thereby transferring the circuit pattern of the mask onto a photoresist pattern on the wafer. Then, a film under the photoresist pattern is etched using the transferred photoresist pattern as an etching mask so that the circuit pattern is formed in the film.

When film patterns are formed by repeatedly performing the photolithography process, alignment between an upper pattern and a lower pattern becomes critical.

Alignment is generally performed by reticle alignment and wafer alignment in an exposure apparatus during the photolithography process. Adjustment of the alignment is performed using correction data obtained by an overlay inspection for a photoresist pattern after exposure and development steps.

In the overlay inspection, vertical and horizontal misalignment, rotation, and orthogonality are measured between an overlay mark formed on the lower pattern (a main scale) and an overlay mark formed on the upper pattern (a vernier), thereby generating correction data to apply in a subsequent exposure step.

The overlay mark, generally having a box shape, is formed on a die cutting line of a wafer (a scribe line).

However, the conventional overlay mark may not be useful for an overlay inspection of a real pattern because the conventional overlay mark has dimensions and shape different from those of the real pattern in a region where a semiconductor device is formed.

The prior art discloses a method for measuring energy applied in an exposure step and for determining a focusing value by comparing standard values with measured values in a photolithography process. The measured values include length variations in a line and space of a cell matching adopter when the length variations are measured with an overlay apparatus after the exposure step is performed. The cell matching adopter has a line and space identical to those of a real pattern, and is included in a monitoring mark formed on a scribe line of a wafer during formation of a mask.

However, the cell matching adopter may not be useful for an inspection of the real pattern because the cell matching adopter is formed around a vernier only, and is identical to the real pattern in size, but not shape.

SUMMARY OF THE INVENTION

Therefore, in an effort to solve the problems mentioned above, it is a feature of an embodiment of the present invention to provide a method for manufacturing a semiconductor device capable of measuring an overlay condition of a real pattern by forming a first mark of an overlay mark identical to a first pattern of the real pattern and by forming a second mark of the overlay mark identical to a second pattern of the real pattern.

It is another feature of an embodiment of the present invention to provide a semiconductor device for measuring an overlay condition of a real pattern with an overlay mark including a first mark identical to a first pattern of the real pattern and a second mark identical to a second pattern of the real pattern.

To provide a feature of an embodiment of the present invention, there is provided a method for forming a semiconductor device including forming a first pattern for a semiconductor device in a semiconductor device formation region of a semiconductor substrate and simultaneously forming the first pattern in a first mark formation region of the semiconductor substrate; forming a second pattern for the semiconductor device on a resultant structure in the semiconductor device formation region of the semiconductor substrate and simultaneously forming the second pattern in a second mark formation region of the semiconductor substrate; and inspecting the first pattern in the first mark formation region and the second pattern in the second mark formation region for misalignments.

In this case, the first mark formation region may be a box shaped main scale formation region, and the second mark formation region may be a box shaped vernier formation region. Also, the first pattern may be an active pattern in a DRAM cell region, and the second pattern may be a word line pattern in the DRAM cell region.

In accordance with a feature of an embodiment of the present invention, for optical proximity correction (OPC), a scattering bar may be formed at an edge of a pattern in a mask corresponding to the first pattern in the first mark formation region, and another scattering bar may be formed at an edge of a pattern in a mask corresponding to the second pattern in the second mark formation region.

To provide another feature of an embodiment of the present invention, there is provided a semiconductor device having an overlay mark, the overlay mark including a first mark formed in a first mark formation region of a semiconductor substrate and a first pattern formed in a semiconductor device formation region of the semiconductor substrate, wherein the first mark and the first pattern are formed simultaneously by a same process such that the first mark has a shape identical to a shape of the first pattern, and a second mark formed in a second mark formation region of the semiconductor substrate and a second pattern formed in the semiconductor device formation region of the semiconductor substrate, wherein the second mark and the second pattern are formed simultaneously by a same process such that the second mark has a shape identical to a shape of the second pattern.

The first pattern may be an active pattern in a DRAM cell region, and the second pattern may be a word line pattern in the DRAM cell region

BRIEF DESCRIPTION OF THE DRAWINGS

These and other features and advantages of the present invention will become readily apparent from the following detailed description of the preferred embodiments when considered in conjunction with the accompanying drawings, in which.

DETAILED DESCRIPTION OF THE INVENTION

Figure 1:
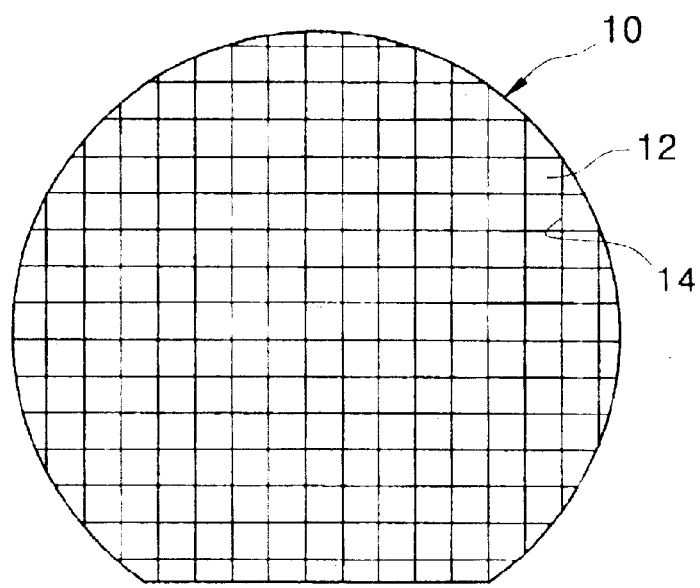
FIG. 1 illustrates a plan view of a wafer.

Korean Patent Application No. 2002-47249, filed Aug. 9, 2002, and entitled: "Method For Manufacturing Semiconductor Device And Semiconductor Device With Overlay Mark," is incorporated by reference herein in its entirety.

Hereinafter, preferred embodiments of the present invention will be described in detail with reference to the accompanying drawings, in which like reference numerals denote like elements throughout.

FIG. 1 illustrates a plan view of a wafer.

Referring to FIG. 1, a semiconductor wafer 10 is divided into a plurality of dies 12 by scribe lines 14. Each of the dies 12 is equivalent to a semiconductor device formation region where a circuit pattern is formed. An alignment mark is formed on each of the scribe lines 14 for alignment of the wafer 10.

Figure 2:
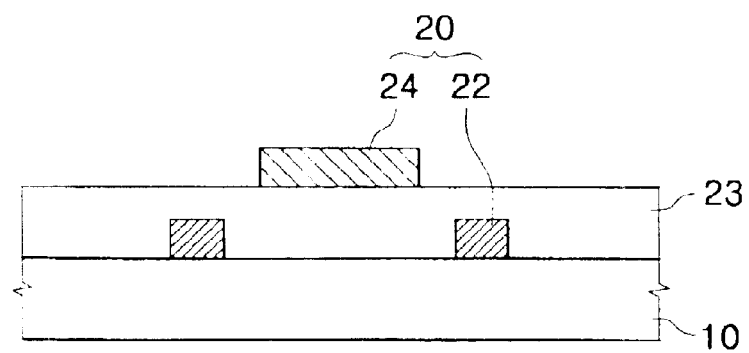
FIG. 2 illustrates a cross-sectional view showing an overlay mark.
Figure 3:
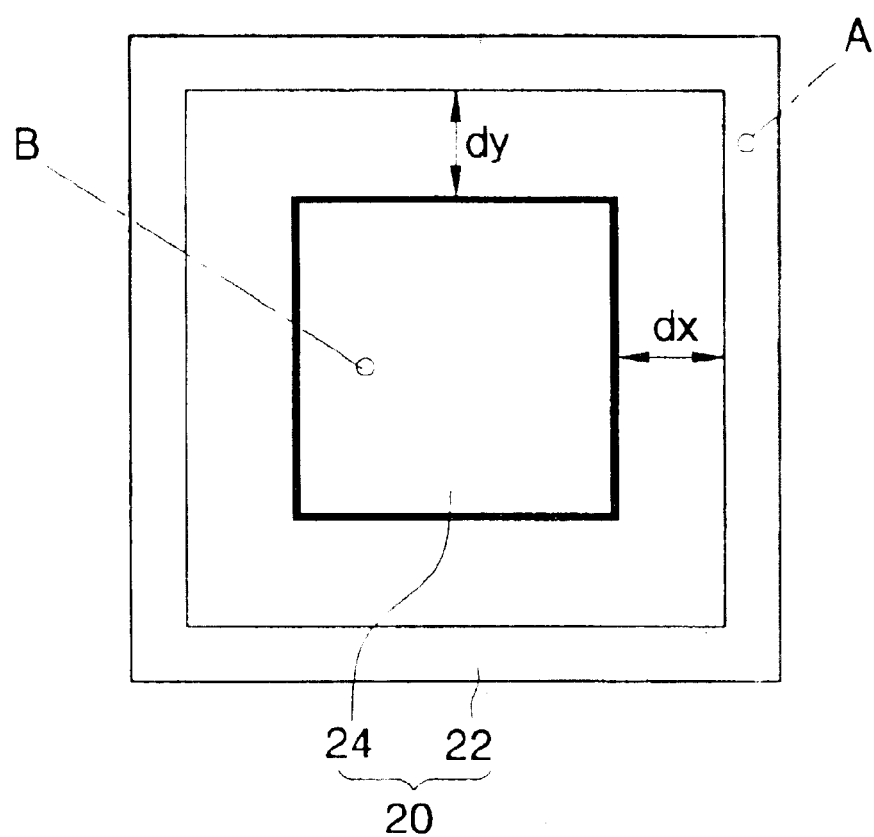
FIG. 3 illustrates a plan view of the overlay mark of FIG. 2.

FIG. 2 illustrates a cross-sectional view of an overlay mark and FIG. 3 illustrates a plan view of the overlay mark of FIG. 2.

Referring to FIGS. 2 and 3, an overlay mark 20 includes a main scale pattern 22 formed on a wafer 10, and a vernier pattern 24 formed over a layer 23 in which the main scale pattern 22 is positioned. The main scale pattern 22 has a box shape and is equivalent to an outer alignment mark. Misalignment between the main scale pattern 22 and the vernier pattern 24 is measured with an overlay measurement apparatus when the wafer 10 having the overlay mark 20 is positioned in the overlay measurement apparatus. The misalignment is measured with the overlay measurement apparatus by measuring a vertical interval (dy) and a horizontal interval (dx) between the main scale pattern 22 and the vernier pattern 24.

Figure 4A:
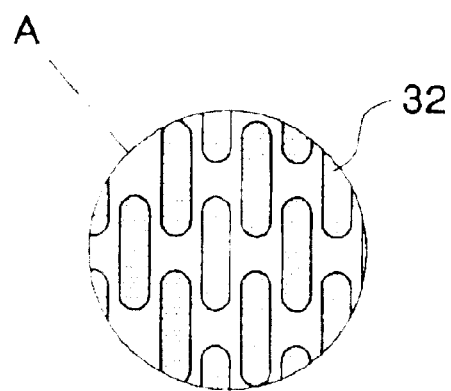
FIGS. 4A and 4B illustrate enlarged views of a first portion A and a second portion B, respectively, in the overlay mark of FIG. 3, according to an embodiment of the present invention.
Figure 4B:
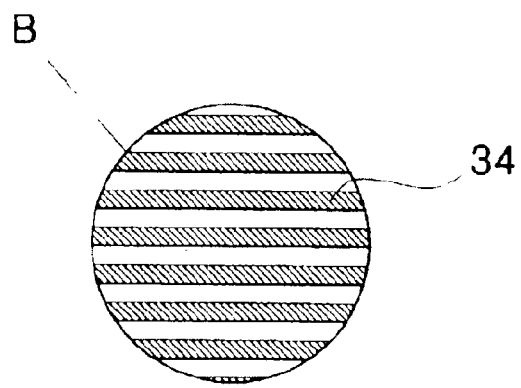

FIGS. 4A and 4B illustrate enlarged views of a first portion A and a second portion B, respectively, in the overlay mark of FIG. 3, according to an embodiment of the present invention.

Referring to FIGS. 3, 4A and 4B, as examples of an embodiment of the present invention, the main scale pattern 22 is an active region pattern 32 in a DRAM cell region, and the vernier pattern 24 is a word line pattern 34 disposed across the active region pattern 32.

Figure 5:
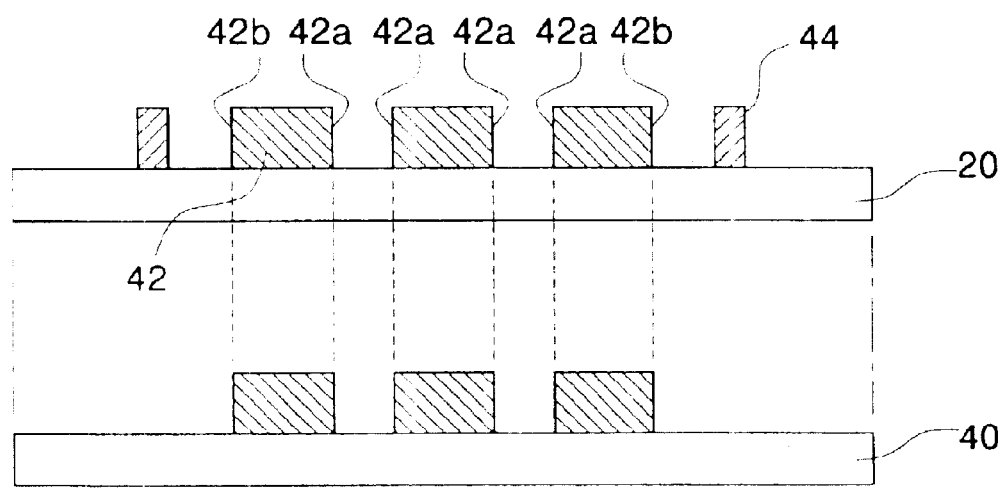
FIG. 5 illustrates a cross-sectional view of a mask of the overlay mark of FIG. 3 having a scattering bar, according to an embodiment of the present invention.

FIG. 5 illustrates a cross-sectional view of a mask of the overlay mark 20 having a scattering bar according to an embodiment of the present invention.

Referring to FIG. 5, an exposure mark of the present invention is formed by transferring a main pattern 42 for an overlay inspection onto a mask substrate 40 after the main pattern 42, preferably made of chrome, and a subsidiary pitcher (an assisted bar, a scattering bar, or an intensity leveling bar) 44 are formed on the mask substrate 40.

In a photolithography process, a pattern of a photomask is transferred onto a wafer through an optical lens. In this case, an image transferred onto the wafer may be distorted because an optical system transmitting the image functions as a low pass filter. That is, the image has a rounded pattern shape because a portion of the image where high frequency is applied, i.e., a corner, is not transmitted, so that when a mask having a rectangular shape is used, an edge or corner portion of the image (where high frequency is applied) is also not transmitted. When a pattern of the mask is large, the image generally has an initial pattern shape by transmitting relatively many orders of the frequency, since a basic spatial frequency is low. However, as a size of a pattern becomes smaller, the spatial frequency becomes higher, and an image becomes more greatly distorted by reducing the number of orders of the frequency transmitted.

By taking distortion of the image into consideration and changing the shape of a mask accordingly, optical proximity correction (OPC) is able to produce a final pattern having a desired shape on a wafer. An optical proximity is generated when adjacent pitchers are interacted with each other to form a pattern dependent modification. For example, patterns disposed to have different proximities of pitches in a layout have different dimensions after a developing step even though the patterns are designed to have identical dimensions. Hence, a group of lines in the pattern that are close to each other may be transmitted differently than another group of lines in the pattern that are separated from each other. A measured overlay value may be distorted when widths of lines in the pattern are not constantly reproduced.

According to an embodiment of the present invention, to precisely transfer an overlay mark formed to have a shape and size identical to those of a cell pattern onto a wafer, the OPC may be minimized by adopting a scattering bar on a mark concerning an overlay mark pattern Referring to FIG. 5, the main pattern 42 of the overlay mark 20 includes a plurality of closed edges 42a and isolated edges 42b. Thus, to provide a peripheral portion of isolated edges 42b on the mask with an OPC identical to that of the closed edges 42a, scattering bars 44 are formed at positions spaced apart from the isolated edges 42b by an interval identical to an interval between the closed edges 42a. A width of the scattering bar 44 is no wider than a minimum width of the main pattern 42, so that the scattering bar 44 is not transferred onto the wafer 10.

Figure 6:
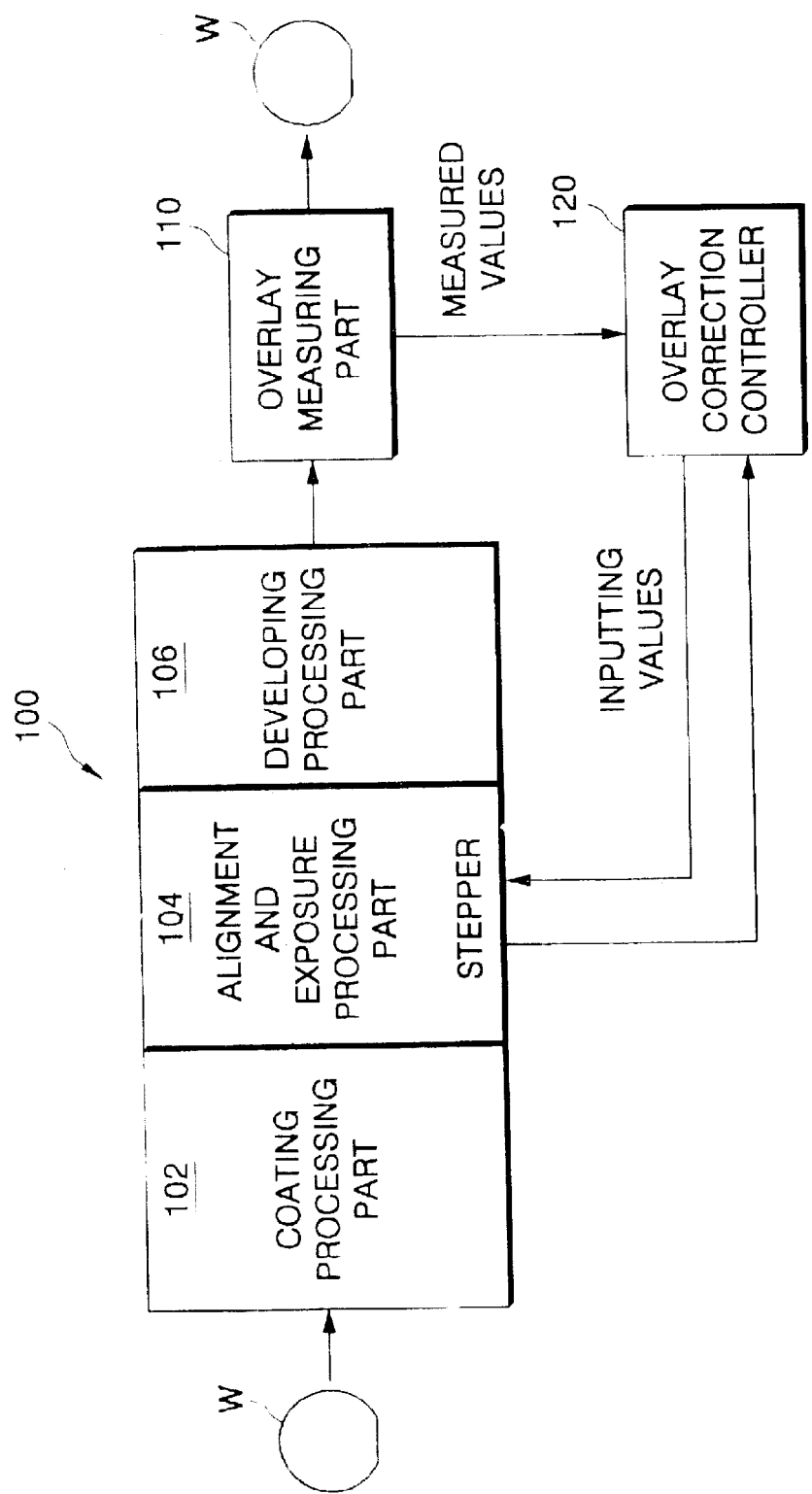
FIG. 6 illustrates a block diagram for showing a control system of an exposure apparatus according to an embodiment of the present invention.

FIG. 6 illustrates a block diagram of a control system of an exposure apparatus according to an embodiment of the present invention.

Referring to FIG. 6, a photo apparatus 100 includes a coating processing part 102, an alignment and exposure processing part 104, and a developing processing part 106.

The photo apparatus 100 deposits a film to be etched on a wafer (W), and forms a photoresist pattern on the film to be etched. Then, the photo apparatus 100 forms a single pattern layer by a photolithography process in which the film is etched using the photoresist pattern as an etching mask.

The steps described above are repeatedly performed with respect to several films so that desired circuit patterns having several overlying films are formed on the wafer, thereby allowing formation of a plurality of integrated circuit chips on a single wafer. Because the photolithography process has the potential to greatly effect yield of a semiconductor device manufacturing process, the photolithography process is crucial to the semiconductor device manufacturing process.

The photolithography process usually includes a coating step, an alignment and exposure step, and a developing step.

In the coating processing part 102, there are performed: a pre-baking step for removing moisture from a surface of the wafer (W) and for improving an adherence between the wafer (W) and a photoresist coated thereon, a scrubbing step for removing impurities on the wafer (W) using highly compressed deionized water and a brush, a spinning step to provide uniform coating, and a soft baking step for volatilizing a solvent in the photoresist and for hardening the photoresist.

In the alignment and exposure part 104, there are performed: a prealigning step for aligning a reticle in accordance with a reference mark, and for aligning the wafer (W) and the reticle, an aligning step for fixing a flat zone of the wafer, and an exposure step for exposing the photoresist after determining an exposure amount.

In the developing processing part 106, there are performed: a post exposure step for removing a standing wave effect, a developing step for selectively removing a portion of the photoresist that has been reacted with an UV light, and a hard baking step for hardening a photoresist pattern on the wafer (W) to sufficiently maintain the shape of the wafer (W) at a high temperature.

Figure 7:
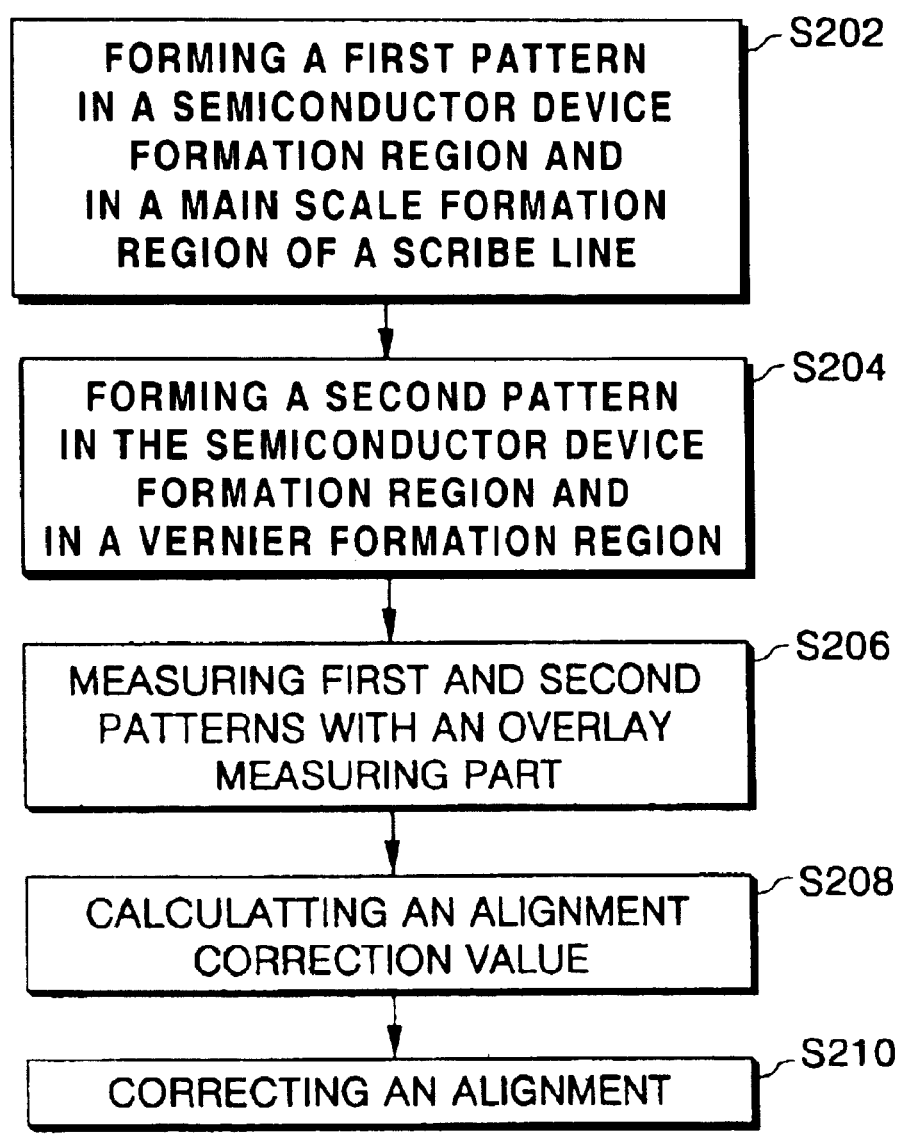
FIG. 7 illustrates a flow chart depicting a method for manufacturing a semiconductor device according to an embodiment of the present invention.

FIG. 7 illustrates a flow chart for showing a method for manufacturing a semiconductor device according to an embodiment of the present invention.

Referring to FIGS. 6 and 7, a first pattern (that is, an active region pattern) is formed in a semiconductor formation region of a semiconductor substrate and in a main scale formation region of a scribe line using the above-described photolithography process (step S202).

An insulation film and a gate electrode film are deposited on the resultant thus obtained, and then a photolithography process is performed with respect to the insulation and the gate electrode films. That is, a photoresist film is formed on the insulation film by coating a photoresist in the coating processing part 102, and exposing the photoresist film with a mask having a vernier pattern in the exposure processing part 104. Subsequently, a photoresist pattern is formed by developing the exposed photoresist film in the developing processing part 106. A word line electrode film is selectively etched using the photoresist pattern as an etching mask. As a result, a second pattern having a shape identical to that of the word line is formed in a vernier formation region and in the semiconductor device formation region of the semiconductor substrate (step S204).

The wafer (W) is inserted into an overlay measuring part 110, which measures an overlay mark that includes the main scale and the vernier having shapes and sizes identical to those of cell patterns (step S206).

As described above, after the photoresist pattern is formed on the wafer (W), misalignment is measured with the overlay measuring part 110 to determine whether the measured misalignment is within a predetermined tolerance.

Figure 8:
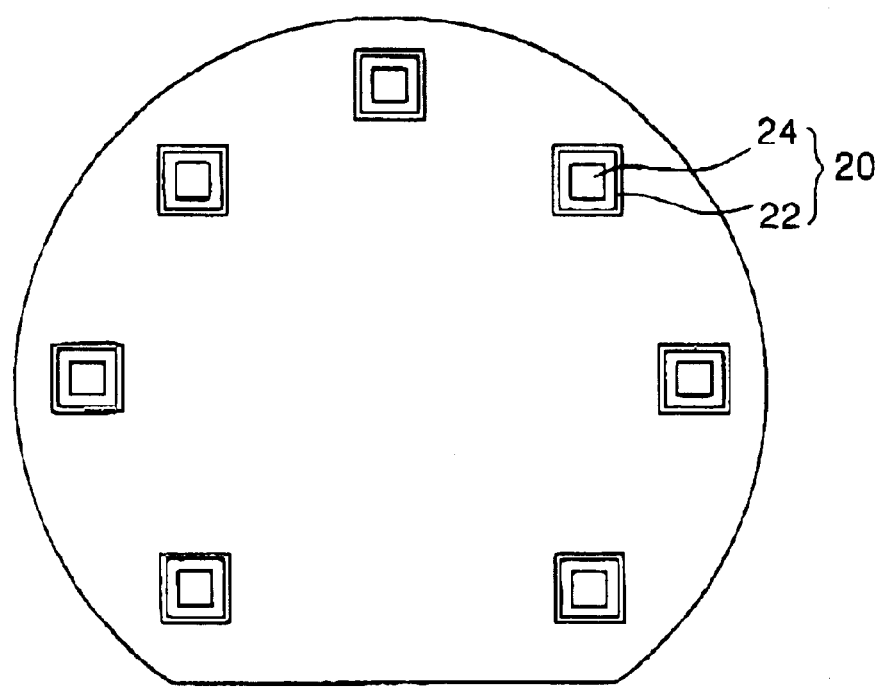
FIG. 8 illustrates a view for explaining a misalignment measuring site.

FIG. 8 illustrates a view for explaining a misalignment measuring site.

Referring to FIGS. 3 and 8, it is impossible for the overlay measuring part 110 (FIG. 6) to measure the misalignment by comparing all of the overlying pattern layers. Hence, the misalignment is measured with respect to a plurality of misalignment measuring sites (MS) formed on the wafer (W). Each of the plurality of misalignment measuring sites (MS) is an overlay mark 20.

After a site to be measured is selected from within the misalignment measuring site (MS) formed on the wafer (W), dx/dy is measured between an outer alignment mark 22 formed on a lower pattern layer of the selected site and an inner alignment mark 24 formed on an upper pattern layer of the selected site. Regression analysis is performed concerning data of the measured dx/dy to extract misalignment parameters as follows:

The misalignment parameters are divided into parameters concerning the wafer and parameters concerning a reticle.

Figure 9A:
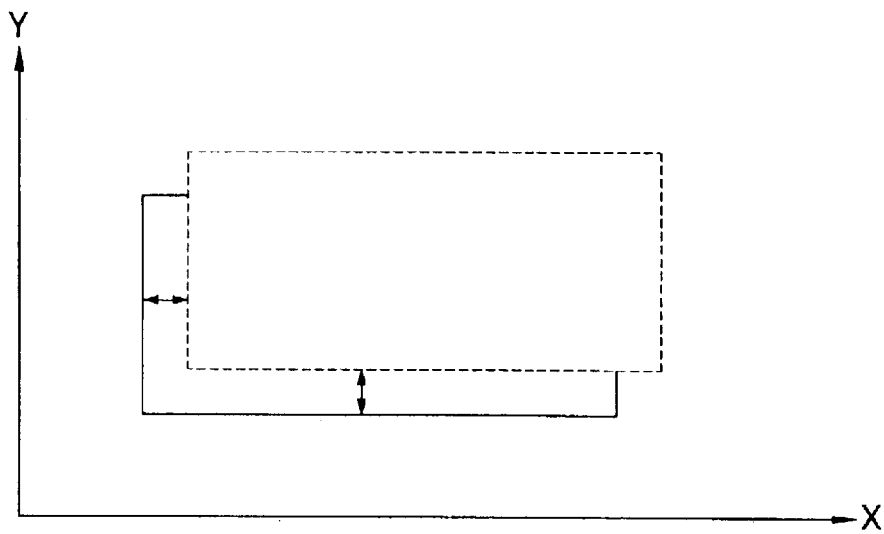
FIGS. 9A to 9C illustrate examples of misalignment parameters concerning a wafer and a reticle.
Figure 9B:
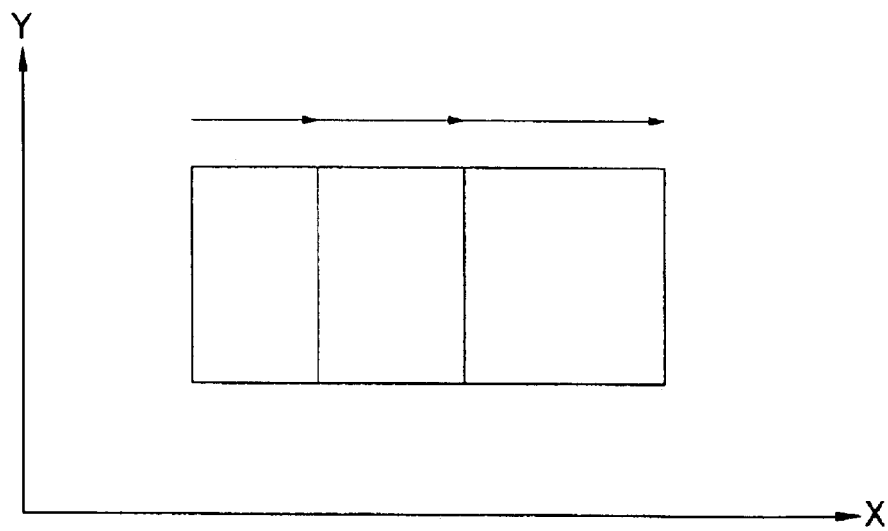
Figure 9C:
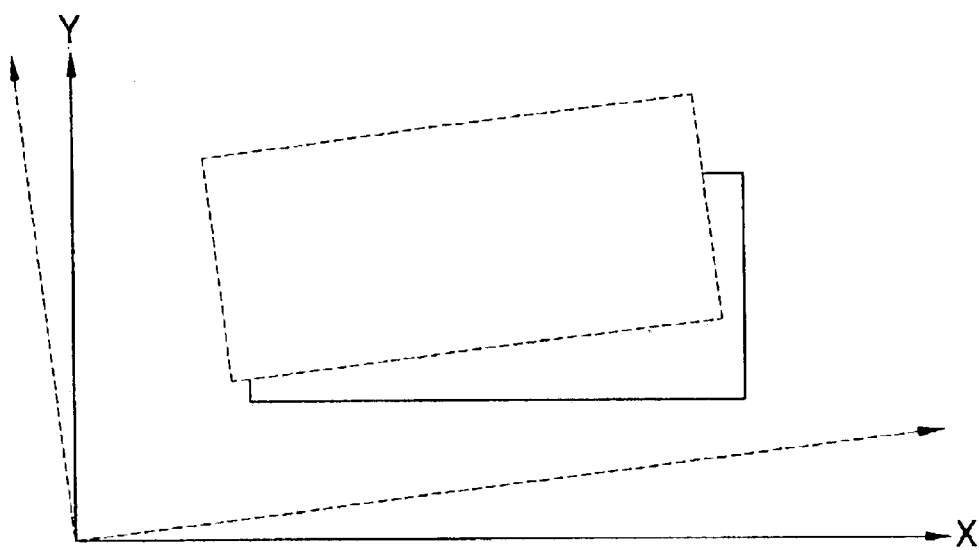

FIGS. 9A, 9B and 9C illustrate examples of misalignment parameters concerning the wafer and a reticle.

1) parameters concerning the wafer:

offset (OF)—a degree of misalignment of the alignment pattern in a vertical (Y) direction and in a horizontal (X) direction (FIG. 9A);

scaling (SC)—an enlarged degree of the pattern on the wafers due to warpage of a wafer or wafer stage moving accuracy, etc., in a vertical (Y) direction and in a horizontal (X) direction (FIG. 9B);

rotation (ROT)—a distorted degree of an axis of the alignment pattern concerning an alignment reference axis (FIG. 9C); and orthogonality (ORT)—a distorted degree between wafer alignment axes of the wafer.

2) parameters concerning a reticle:

reticle rotation (ROT)—a distorted degree of the axis of the alignment pattern concerning the alignment reference axis due to an incorrect set of the reticle (FIG. 9C); and reticle reduction (RED)—an enlarged degree of the pattern on the wafer in a vertical direction (Y) and in a horizontal (X) direction due to the incorrect set of the reticle (FIG. 9B);

The alignment and exposure part 104, which may be a stepper, includes a wafer stage, a lens system, the reticle, and a light source system.

When a light generated from the light source system is applied onto the wafer through a mask pattern of the reticle and the lens system, the mask pattern of the reticle is reductively projected onto the wafer. Therefore, the wafer alignment requires correction of distortions of an X-axis and a Y-axis, distortions of rotation and orthogonality of the wafer disposed on the wafer stage, and horizontal distortion of an image projected onto the wafer. In addition, reticle alignment requires correction for rotation and reduction of the reticle.

Thus, the overlay measuring part 110 provides an overlay correction controller 120 with data including a measurement time, lot identification data and ten measurement parameters such as OF-X, OF-Y, SC-X, SC-Y, ORT, W-ORT, RED-X, RED-Y, ROT-X and ROT-Y (step S208).

The overlay correction controller 120 generates inputting values using provided correction values, and then provides the inputting values to the stepper 104, thereby correcting the misalignment through an overlay correction by the stepper 104 (step S210).

Therefore, misalignments of the active region and word line of the wafer may be reduced by alignment correction through the above-described overlay measurement process.

As described above, by forming an overlay mark to have a shape and size identical to those of a real pattern in a semiconductor device formation region of a semiconductor substrate, the present invention may allow an overlay mismatch between the region where the semiconductor device is formed and the overlay mark to be prevented, thereby minimizing misalignment of layers in a semiconductor device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method for forming a semiconductor device, comprising:

forming a first pattern for a semiconductor device in a semiconductor device formation region of a semiconductor substrate and simultaneously forming the first pattern in a first mark formation region of the semiconductor substrate;

forming a second pattern for the semiconductor device on a resultant structure in the semiconductor device formation region of the semiconductor substrate and simultaneously forming the second pattern in a second mark formation region of the semiconductor substrate; and inspecting the first pattern in the first mark formation region and the second pattern in the second mark formation region for misalignments, wherein the first pattern is an active pattern in a DRAM cell region, and the second pattern is a word line pattern in the DRAM cell region.

2. The method for forming a semiconductor device as claimed in claim 1, wherein the first mark formation region is a box shaped main scale formation region, and the second mark formation region is a box shaped vernier formation region.

3. The method for forming a semiconductor device as claimed in claim 1, wherein a scattering bar is formed at an edge of a pattern in a mask corresponding to the first pattern in the first mark formation region.

4. The method for forming a semiconductor device as claimed in claim 1, wherein a scattering bar is formed at an edge of a pattern in a mask corresponding to the second pattern in the second mark formation region.

* * * * *